(12) United States Patent
Liu et al.

(10) Patent No.: US 7,300,602 B2
(45) Date of Patent: Nov. 27, 2007

(54) SELECTIVE BARRIER METAL POLISHING SOLUTION

(75) Inventors: Zhendong Liu, Newark, DE (US); Ross E. Barker, II, Middletown, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 360 days.

(21) Appl. No.: 10/349,792

(22) Filed: Jan. 23, 2003

(65) Prior Publication Data
US 2004/0147118 A1 Jul. 29, 2004

(51) Int. Cl.
C09K 13/00 (2006.01)
C09K 13/04 (2006.01)
C09K 13/06 (2006.01)
H01L 21/302 (2006.01)

(52) U.S. Cl. ............... 252/79.1; 252/79.2; 252/79.4; 438/692

(58) Field of Classification Search ............... 252/79.1, 252/79.2, 79.4; 438/692
See application file for complete search history.

(56) References Cited

U.S. PATENT DOCUMENTS

| | | | |
|---|---|---|---|
| 5,614,444 A | 3/1997 | Farkas et al. | |
| 5,851,845 A * | 12/1998 | Wood et al. | 438/15 |
| 5,954,997 A * | 9/1999 | Kaufman et al. | 252/79.1 |
| 6,117,775 A | 9/2000 | Kondo et al. | |
| 6,316,366 B1 | 11/2001 | Kaufman et al. | |
| 6,372,111 B1 * | 4/2002 | Watts | 205/101 |
| 6,375,693 B1 | 4/2002 | Cote et al. | |
| 6,409,781 B1 | 6/2002 | Wojtczak et al. | |
| 6,436,811 B1 | 8/2002 | Wake et al. | |
| 2002/0042199 A1 | 4/2002 | Bian et al. | |

(Continued)

FOREIGN PATENT DOCUMENTS

EP 0 811 665 A2 12/1997

(Continued)

OTHER PUBLICATIONS

Van Muylder, J.; Pourbaix, M.; "Tanlalum($^1$)", Atlas of Electrochemical Equilibria in Agueous Solutions, Section 9.3, 1966, pp. 251-255; Pergamon Press, Oxford, England.

(Continued)

Primary Examiner—Nadine G. Norton
Assistant Examiner—Lynette T. Umez-Eronini
(74) Attorney, Agent, or Firm—Blake T. Biederman

(57) ABSTRACT

The polishing solution is useful for removing barrier materials in the presence of interconnect metals and dielectrics. The polishing solution comprises, by weight percent, 0.1 to 10 hydrogen peroxide, at least one pH adjusting agent selected from the group consisting of nitric acid, sulfuric acid, hydrochloric acid and phosphoric acid for adjusting a pH level of the polishing solution to less than 3, at least 0.0025 benzotriazole inhibitor for reducing removal rate of the interconnect metals, 0 to 10 surfactant, 0.01 to 10 colloidal silica having an average particle size of less than 50 nm and balance water and incidental impurities. The polishing solution has a tantalum nitride material to copper selectivity of at least 3 to 1 and a tantalum nitride to TEOS selectivity of at least 3 to 1.

10 Claims, 6 Drawing Sheets

U.S. PATENT DOCUMENTS

| | | |
|---|---|---|
| 2002/0066234 A1 | 6/2002 | Cote et al. |
| 2002/0104269 A1 | 8/2002 | Sun et al. |
| 2002/0106897 A1 | 8/2002 | Bian et al. |
| 2002/0124474 A1 | 9/2002 | Wojtczak et al. |
| 2003/0124959 A1 | 7/2003 | Schroeder et al. |
| 2003/0131535 A1 | 7/2003 | Small et al. |

FOREIGN PATENT DOCUMENTS

| | | |
|---|---|---|
| EP | 1 081 200 A1 | 3/2001 |
| EP | 1 223 609 | 7/2002 |
| WO | WO 00/00567 A1 | 1/2000 |
| WO | WO 02/18099 A2 | 3/2002 |

OTHER PUBLICATIONS

Steigerwald, J.M.; Murarka, S.P.; Duquette. D.J.; Gutmann, R.J.; "Surface Layer Formation During the Chemical Mechanical Polishing of Copper Thin Films", Mat. Res. Soc. Symp. Proc., 1994, pp. 133-139. vol. 337: Materials Research Society.

Carpio, R.; Farkas, J.; Jairath, R.; "Initial study on copper CMP slurry chemistries", Thin Solid Films 266, 1995, pp. 238-244; Elsevier Science S.A.

Luo, Q.; Campbell, D.R.; Babu, S.V.; "Chemical-Mechanical Polishing of Copper in Acidic Media"; CMP-MIC Catalog No. 96ISMIC-100P/96/0145, Feb. 22-23, 1996; pp. 145-151.

Brusic, V.; Kistler, R.; Wang, S.; Hawkins, J.; Schmidt, C.; "A Cautious Approach to the Removal of Ta in the CMP Polishing of Cu/Ta Structures", Electrochemical Society Proceedings, 1998, pp. 119-125, vol. 98-7.

Ramarajan, S.; "Chemical-Mechanical Planarization of Copper/Tantalum for Microelectronic Applications"; Ph. D. Thesis, Clarkson University, Jun. 23, 2000; UMI Dissertation Services, Ann Arbor, MI.

Hariharaputhiran, M.; "Mechanism of Dissolution and Planarization of Copper/Tantalum Films during Chemical-Mechanical Polishing", Ph. D. Thesis, Clarkson University, Jul. 24, 2000; UMI Dissertation Services, Ann Arbor, MI.

Li, Y; Babu, S.V.: "Chemical Mechanical Polishing of Copper and Tantalum in Potassium Iodate-Based Slurries"; Electrochemical and Solid-State Letters, 2001, 4 (2), pp. G20-G22; The Electrochemical Society, Inc.

Li, Y.; Babu, S.V.; "Copper and Tantalum Chemical-Mechanical Planarisation: Some Recent Progress"; Semiconductor Fabtech, Mar. 2001, pp. 259-261, 13th Edition.

Li, T.; Hariharaputhiran, M.; Babu, S.V.; "Chemical-mechanical polishing of copper and tantalum with silica abrasives", J. Mater. Res., Apr. 2001, pp. 1066-1073, vol. 16, No. 4; Materials Research Society.

* cited by examiner

SELECTIVE BARRIER METAL POLISHING SOLUTION

BACKGROUND OF THE INVENTION

The invention relates, generally, to chemical mechanical planarizing (CMP) processes for removing barrier metals and, more particularly, to polishing compositions for selectively removing barrier metals in the presence of interconnect structures in integrated circuit devices.

In recent years, the semiconductor industry has increasingly relied upon copper electrical interconnects in forming integrated circuits. These copper interconnects have a low electrical resistivity and a high resistance to electromigration. Since copper is very soluble in many dielectric materials, such as silicon dioxide and low-K or doped versions of silicon dioxide, a diffusion barrier layer is necessary to prevent the diffusion of copper into the underlying dielectric material. Typical barrier materials include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In response to increasing demands for high density integrated circuits, manufacturers now fabricate integrated circuits containing multiple overlying layers of metal interconnect structures. During device fabrication, planarizing each interconnect layer improves packing density, process uniformity, product quality and most importantly, enables chip manufacturers to fabricate multiple layer integrated circuits. Chip manufacturers rely upon chemical-mechanical-planarizing (CMP) as a cost effective means of producing flat substrate surfaces. The CMP process is typically carried out in a two-step sequence. First, the polishing process uses a "first-step" slurry specifically designed to rapidly remove copper. For example, Carpio et al., in "Initial study on copper CMP slurry chemistries" Thin Solid Films, 262 (1995), disclose the use on a 5 weight percent nitric acid solution for efficient copper removal. Similarly, Kondo et al., in U.S. Pat. No. 6,117,775, disclose the use of nitric acid and BTA for copper removal.

After the initial copper removal, a "second-step" slurry removes the barrier material. Typically, second-step slurries require excellent selectivity to remove the barrier material without adversely impacting the physical structure or electrical properties of the interconnect structure.

Because it was traditionally perceived that alkaline polishing slurries have a much higher Ta/TaN removal rate than acidic slurries, commercial second-step slurries typically have a basic to neutral pH. Another factor pointing to the advantages of neutral to basic pH barrier metal polishing slurries relates to the need to preserve the metal overlying the barrier metal during the second-step polishing. The metal removal rate should be very low to reduce dishing of the metal interconnects.

In acidic slurries that include oxidizing agents, copper tends to have both a high removal rate and a high static etch rate. Cote et al. however, in U.S. Pat. No. 6,375,693, disclose an acidic CMP slurry for barrier materials. The slurry of Cote et al. operates with a hydrogen peroxide oxidizer, a benzotriazole inhibitor and a sulfated fatty acid at a pH range of 2 to 7.5. Similarly, Wojtczak et al., in U.S. Pat. No. 6,409,781, disclose an acidic polishing slurry that relies upon a potassium iodate oxidizer, iminodiacetic acid as the copper corrosion inhibitor and nitric acid as the copper activator to selectively polish the barrier material.

Future low k and ultra-low k integrations of the IC structure will require low metal and dielectric losses in the CMP step. Accordingly, a selective slurry for barrier removal will most probably be adopted. While neutral-to-basic polishing slurries have advantages known to those skilled in the art, such as those described above, these slurries also tend to have low tantalum removal rates. In addition, because tantalum is readily oxidized, the oxidizing agents in the slurry can react with the tantalum to form an oxide layer on the surface. In view of the above, there exists a need to provide a second-step slurry that possesses both a rapid dissolution of barrier materials and excellent selectivity to both interconnect metals and dielectric materials.

STATEMENT OF THE INVENTION

The invention provides a polishing solution useful for removing barrier materials in the presence of interconnect metals and dielectrics. The polishing solution comprises, by weight percent, 0.1 to 10 hydrogen peroxide, at least one pH adjusting agent selected from the group consisting of nitric acid, sulfuric acid, hydrochloric acid and phosphoric acid for adjusting a pH level of the polishing solution to less than 3, at least 0.0025 benzotriazole inhibitor for reducing removal rate of the interconnect metals, 0 to 10 surfactant, 0 to 10 colloidal silica having an average particle size of less than 50 nm and balance water and incidental impurities. The polishing solution has a tantalum nitride to copper selectivity of at least 3 to 1 and a tantalum nitride to TEOS selectivity of at least 3 to 1 as measured with a polishing pad pressure measured normal to a wafer less than 15 kPa.

The method removes barrier materials from a semiconductor substrate in the presence of interconnect metals comprises the step of planarizing the semiconductor substrate with the above polishing solution and a polishing pad at a pressure normal to the semiconductor substrate of less than 15 kPa to provide a tantalum nitride to copper selectivity of at least 3 to 1 and a tantalum nitride to TEOS selectivity of at least 3 to 1.

DETAILED DESCRIPTION

Figure 1:
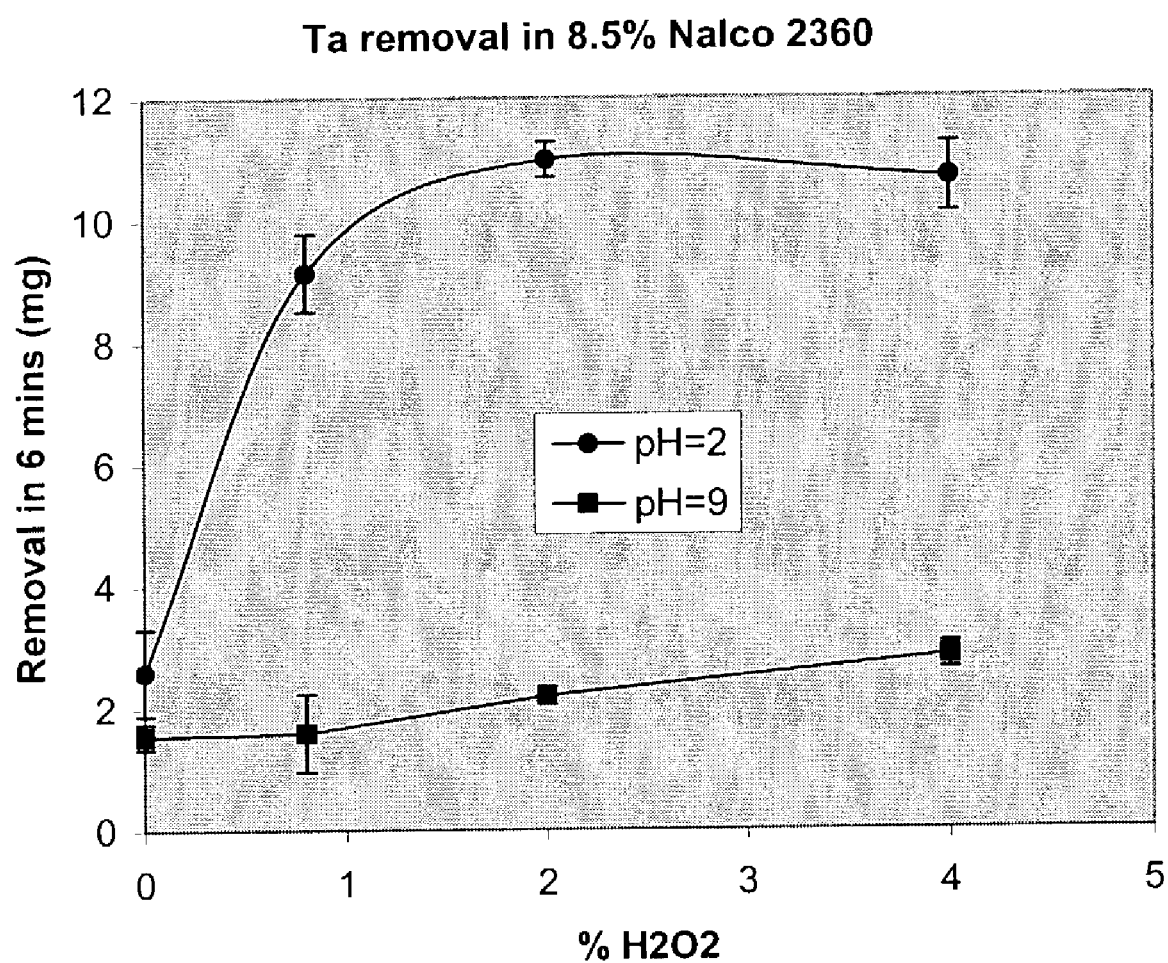
FIG. 1 illustrates a comparison plot of Ta removal rate versus $H_2O_2$ concentration for a polishing composition (8.5% Nalco 2360) at a pH of 2 and a polishing composition at a pH of 9.

The present invention provides a barrier metal polishing solution having an acidic pH of less than 3 that includes a colloidal silica abrasive, a hydrogen peroxide oxidizing agent, a benzotriazole corrosion inhibitor, and an inorganic pH adjusting agent. For purposes of the specification, polishing solution refers to aqueous polishing solutions that may or may not include abrasives. If the polishing solution includes an abrasive, then the polishing solution also is a polishing slurry. The polishing solution can also optionally include surfactants, chelating agents, pH buffers and defoming agents.

For purposes of this specification, dielectric includes silica-base materials such as TEOS, low k and ultra-low k materials (some ultra-low materials are not silica-based). To polish low k and ultra-low k dielectric materials, it is important to maintain low pressure to minimize the delamination and fracture of these materials. However, low pressure yields low barrier material (Ta/TaN) removal rate, which is undesirable for wafer throughput. Fortunately, acidic polishing solutions having a strong oxidizer have demonstrated high barrier removal rates in comparison to conventional alkaline barrier slurries that operate at low pressures. The barrier material may include the following: tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

The barrier metal polishing composition includes an optional colloidal silica abrasive for abrasive or "mechanical" removal of the barrier material. The colloidal silica has a concentration in the aqueous phase of the polishing composition of 0 to 10 weight percent—this specification refers to all concentrations in weight percent, unless specifically expressed otherwise. If the polishing composition does not contain abrasives, then pad selection and conditioning becomes more important to the CMP process. For example, for some silica-free compositions a fixed abrasive pad improves polishing performance. Advantageously, the colloidal silica concentration is 0.01 to 5 weight percent. And most advantageously, the colloidal silica concentration is 0.1 to 2 weight percent.

The colloidal silica has an average particle size of less than 50 nm for preventing excessive metal dishing and dielectric erosion. For purposes of this specification, particle size refers to the colloidal silica's average particle size. Advantageously, the silica has an average particle size of less than 30 nm to further reduce metal dishing and dielectric erosion. Most advantageously, an average particle size less than 15 nm removes the barrier metal an acceptable rate without excessive removal of the dielectric material. For example, the least dielectric erosion and metal dishing occur with a colloidal silica having an average particle size is 2 to 15 nm. Decreasing the size of the colloidal silica tends to improve the selectivity of the solution; but it also tends to decrease the barrier removal rate. In addition, the preferred colloidal silica may include additives, such as dispersants to improve the stability of the silica at acidic pH ranges. One such colloidal silica is available from Clariant S. A., of Puteaux, France.

It has been discovered that the removal rate of barrier materials, such as tantalum and tantalum nitride is greatly accelerated by the oxidizer hydrogen peroxide. This finding is in contradiction to the prior art in this field, which teaches that oxidizers passivate tantalum and lower its removal rate. The hydrogen peroxide has a concentration in the aqueous phase of 0.1 to 10 weight percent. Advantageously, the hydrogen peroxide has a concentration of 0.1 to 5 weight percent. Most advantageously, the hydrogen peroxide has a concentration of 0.1 to 2 weight percent. Since hydrogen peroxide degrades rapidly and has a short shelf life it is most advantageous to mix the hydrogen peroxide into the solution at the point of use.

The barrier metal polishing solution has an acidic pH to lower interconnect metal removal rate and to reduce interconnect metal dishing during the CMP processing of the underlying barrier metal. Advantageously, the interconnect metal is selected from the group consisting of copper, copper alloys, silver and silver alloys. Most advantageously, the interconnect metal is copper. In acidic slurries of the prior art that include oxidizers, such as $H_2O_2$, both the copper removal rate and the static etching rate are high. To solve this problem, the present polishing solution employs a primary benzotriazole (BTA) corrosion inhibitor and an optional secondary corrosion inhibitor, such as a surfactant, to further decrease the copper corrosion rate. The corrosion inhibitors function to minimize copper oxidation by the oxidizing agent in the acidic polishing composition. When both primary and secondary corrosion inhibitors are used, the combined action of the primary and secondary corrosion inhibitors substantially prevents the oxidation of the interconnect metal, such as copper during the CMP process. This, in turn, facilitates improved polishing performance by reducing dishing of the interconnect metal.

The primary corrosion inhibitor is benzotriazole (BTA). The BTA has a concentration in the aqueous phase of at least 0.0025 weight percent. The solution operates with a relatively large quantity of BTA inhibitor for reducing copper removal rate. In fact, the solution can operate with a BTA-saturated solution. Typical polishing solutions can contain up to 1.7 weight percent BTA. But excessive BTA concentrations tend to have little, if any, incremental impact on lowering interconnect metal removal rate. Advantageously, the solution has a BTA concentration of 0.25 to 1 weight percent. At BTA concentrations above 0.25 weight percent, a secondary corrosion inhibitor is unnecessary.

An optional secondary corrosion inhibitor for the metal interconnect may be 0 to 10 weight percent surfactant. Most advantageously, the polishing solution contains 0 to 5 weight percent surfactant. For example, an anionic surfactant having a functional group, such as a sulfonate, sulfate, carboxylate, phosphate, or a derivative of these functional groups serve to dramatically reduce the BTA required to suppress removal rate of copper interconnects. Further, the secondary corrosion inhibitor can be a nonionic surfactant, such as a silicon-based compound, a fluorine-based compound, an ester, ethylene oxide, an alcohol, an ethoxylate, an ether, a glycoside, or a derivative of these compounds. In addition, the secondary corrosion inhibitor can be an azole compound or a derivatives thereof, such as, tolytriazole (TTA), imidazole, and the like. Additional optional secondary inhibitor compounds include: amphoteric surfactants and polymers, such as polycarboxylates and their derivatives, polyacrylamides and their derivatives, cellulose, polyvinylalcohols and their derivatives, and polyvinylpyrrolidones and their derivatives.

Most advantageously, the secondary corrosion inhibitor is a sodium dodecylbenzenesulfonate surfactant. When present, the sodium dodecylbenzenesulfonate is present in the aqueous phase at a concentration of 0.0001 to 5 weight percent. Advantageously, the sodium dodecylbenzenesulfonate is present in an amount of 0.0001 to 0.5 weight percent. Most advantageously, the polishing solution contains 0.01 to 0.05 weight percent sodium dodecylbenzenesulfonate.

The polishing composition includes an inorganic pH adjusting agent to reduce the pH of the polishing composition to an acidic pH less than 3. The pH adjusting agent is an inorganic acid, such as nitric acid, sulfuric acid, hydrochloric acid and phosphoric acid. The most advantageous pH adjusting agent is nitric acid ($HNO_3$). Advantageously, the acid creates a solution having a pH of 1.5 to 2.9. Most advantageously, the pH is 2 to 2.8. Because silica has an isoelectric point at a pH of 2, the solution may not be kinetically stable near this pH; and the silica particles may tend to coagulate without the use of dispersion agents near the isoelectric point.

At a pH below 3, the polishing composition can provide a high barrier metal removal rate, even with a relatively low abrasive concentration. This low abrasive concentration can improve the polishing performance of a CMP process by reducing undesired abrasive induced defects, such as scratching. Also, a pH below 3, the polishing composition can be formulated with abrasive particles having a relatively small particle size. For example, a particle size of as small as approximately 10 nm still provides an acceptable Ta/TaN removal rate. By employing an abrasive having a relatively small particle size and formulating the acidic polishing composition at a low abrasive concentration, polishing defects are reduced to excellent levels.

The solution enables the CMP apparatus to operate with a low pad pressure, for example at 7.5 to 15 kPa and, in certain cases, even below 7.5 kPa. The low CMP pad pressure improves polishing performance by reducing scratching and other undesired polish defects and minimizes damage to fragile materials. For example, low dielectric constant materials fracture and delaminate, if exposed to high compressive forces. Further, the high barrier metal removal rate obtained by the acidic polishing solution enables effective barrier metal polishing using a low abrasive concentration and a small particle size.

The polishing solution has a tantalum nitride to copper selectivity of at least 3 to 1 and a tantalum nitride to TEOS selectivity of at least 3 to 1 as measured with a polishing pad pressure measured normal to a wafer less than 15 kPa. Advantageously, the polishing solution has a tantalum nitride to copper selectivity of at least 4 to 1 and a tantalum nitride to TEOS selectivity of at least 4 to 1 as measured with a polishing pad pressure measured normal to a wafer less than 15 kPa. Most advantageously, the polishing solution has a tantalum nitride to copper selectivity of at least 5 to 1 and a tantalum nitride to TEOS selectivity of at least 5 to 1 as measured with a polishing pad pressure measured normal to a wafer less than 10 kPa. This high level of selectivity allows a chip manufacturer to remove the barrier material without removing excess dielectric or interconnect material.

One optional component is a chelating or complexing agent to adjust the copper removal rate relative to the barrier metal removal rate. The chelating agent improves the copper removal rate by forming a chelated metal complex with copper. The chelating agent can be a carboxylic acid, an amino-carboxylic acid and derivatives thereof, and the like. Preferably, the chelating agent has a concentration in the aqueous phase of 0 to 5 weight percent. The polishing composition can also optionally include buffering agents such as various organic and inorganic acids, and amino acids or their salts with a pKa in the pH range of 1.5 to less than 3. The polishing composition can further optionally include defoaming agents, such as an non-ionic surfactants including esters, ethylene oxides, alcohols, ethoxylate, silicon compounds, fluorine compounds, ethers, glycosides and their derivatives, and the like. The defoaming agent can also be an amphoteric surfactant.

EXAMPLES

Several experiments were conducted to determine the polishing performance of the inventive polishing composition at varying component concentrations. Polishing experiments were performed using either a Buehler Ecomet CMP system, a Strasbaugh 6EC, IPEC 472, or an Applied Materials Mirra.

Several polishing compositions were prepared to evaluate the polishing performance at varying concentration levels of select components and at various pH levels. All slurries were prepared in three gallon (11.3 liter) buckets by first adding DI water, followed by mixing in the various chemical components to form the aqueous phase. The pH was then adjusted by adding an amount of nitric acid to obtain a desired pH value. Once the aqueous phase was formed, colloidal silica was added sufficient to form solutions having 1 wt. % to 8.5 wt. % silica in the aqueous phase.

Two different colloidal silica particles were used in these preliminary scooping experiments. Nalco 2360 and the Klebosol series. The colloidal silica particles are listed below in Table 1.

TABLE 1

| Product name | Average particle size (nm) | pH region stabilized |
| --- | --- | --- |
| Nalco 2360 | 60 | Acid |
| Klebosol PL150H25 | 25 | Acid |
| Klebosol PL150H20 | 20 | Acid |
| Klebosol PL20H12 | 12 | Acid |
| Klebosol PL10H9 | 9 | Acid |

The Klebosol colloidal silica was stabilized at a pH of approximately 2.4. Although the stability of colloidal silica in polishing compositions having a relatively low pH is of concern in the industry, the above colloidal silica products described above can employ additives that stabilize the particles.

Example 1

Test substrates were polished using the Buehler CMP system with two polishing compositions formulated to have different pH values. Each of a first and second polishing composition contained a pH adjusting agent and varying amounts of $H_2O_2$ and 8.5 wt. % colloidal silica. The abrasive phase of each slurry was formulated using Nalco 2360 colloidal silica particles. One polishing composition was formulated to have a pH of 2 and the other was formulated to have a pH of 9. The polishing experiments were carried out using a tantalum (99.95%) substrate manufactured by Target Materials Inc. The substrate measured 1 inch (2.5 cm) in diameter and were 0.118 inch (0.30 cm) thick.

The tantalum removal rates as a function of $H_2O_2$ concentration for the polishing composition formulated in accordance with the invention at a pH of 2 and a basic second polishing composition formulated at a pH of 9 are shown in FIG. 1. To determine the amount of metal removed from each substrate, the weight of the metal disk was measured before and after each polishing run. The amount of metal removed in milligrams after six minutes of polishing time was determined for each polishing run.

To obtain the data shown in FIG. 1, the Buehler CMP system was equipped with an IC1000, k-grooved polishing pad manufactured by Rodel, Inc. The polishing pad was conditioned for 2 minutes between each polishing run for each test using a diamond disk conditioner. The polishing runs were carried out using a calculated pad pressure of 6.4 psi (44.1 kPa) and a 70 rpm table speed and a polishing composition flow rate of 100 ml/min.

As illustrated in FIG. 1, the polishing composition having a pH of 2 exhibits a significant increase in Ta removal when compared to the polishing composition having a pH of 9. The improved Ta removal rate is even more pronounced as the $H_2O_2$ concentration is varied from 0 wt. % to 4 wt. %.

Experiments were also carried out using polishing compositions formulated with a Klebosol abrasive phase and an aqueous phase having a pH of 2.5. The Ta removal rate was measured as the $H_2O_2$ concentration was increased from 0 wt. % to 4 wt. %—letters designate comparative slurries and numerals designate examples of the invention. For these experiments, the Buehler CMP system was equipped with an IC1010/Suba IV polishing pad. The data is shown below in Table 2.

TABLE 2

| Slurry | Klebosol PL150H25, % | BTA, % | $H_2O_2$, % | pH | Average Ta removal, mg |
|---|---|---|---|---|---|
| A | 4 | 0.4 | 0 | 2.5 | 6.4 |
| 1 | 4 | 0.4 | 0.5 | 2.5 | 8.5 |
| 2 | 4 | 0.4 | 1 | 2.5 | 8.9 |
| 3 | 4 | 0.4 | 1.5 | 2.5 | 9.8 |
| 4 | 4 | 0.4 | 2 | 2.5 | 10.9 |
| 5 | 4 | 0.4 | 4 | 2.5 | 13 |

These data show a steady increase in Ta removal with increasing $H_2O_2$ concentration. The data shown in FIG. 1 and Table 2 represent a departure from the expected Ta removal rate with increasing oxidizer concentration—conventional basic polishing compositions normally exhibit a decreased Ta removal rate with higher oxidizer concentration.

Example 2

Test substrates were polished using the Strasbaugh CMP system with four polishing compositions each formulated to have a different pH value. For these experiments the Strasbaugh CMP system was equipped with an IC1010/Suba IV polishing pad of Rodel, Inc. Two of the polishing compositions contained 1 wt. % Klebosol PL150H20 colloidal silica and the remaining two compositions contained 4 wt. % Klebosol PL150H20 colloidal silica. Further, the polishing experiments were carried out using a pad pressure of 1 psi (6.9 kPa) and 2 psi (13.8 kPa) for each polishing composition using 200 mm diameter silicon substrates obtained from Wafernet Inc. The substrates included thin film layers of either 15,000 angstroms of electroplated Cu, 15,000 angstrom $SiO_2$ deposited by CVD using TEOS source gas, or 2000 angstroms of CVD TaN overlying the silicon.

The polishing process was performed at 0.5 psi (3.4 kPa) back pressure and 120 rpm table speed. Other parameters included a carrier speed of 114 rpm and a 200 ml/min slurry flow rate. The polishing time was varied for the different thin films as follows: 1 to 5 minutes for Cu, 1 minute for $SiO_2$, and 30 seconds for TaN. The IC1010/Suba IV polishing pad was conditioned between each run using a DiaGrid Kinik conditioner.

Figure 2:
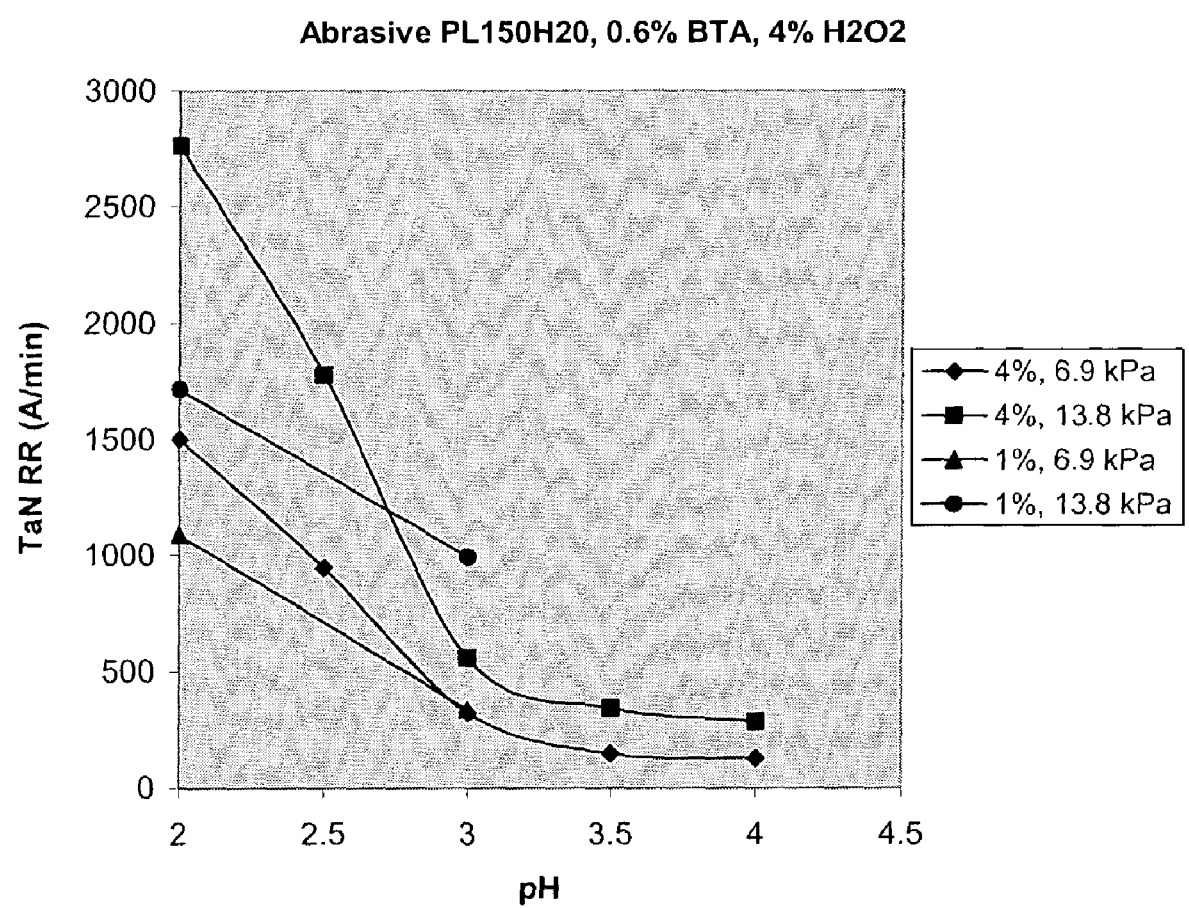
FIG. 2 illustrates a plot of TaN removal rate versus pH level for polishing compositions containing 0.6% BTA and 4% $H_2O_2$ and colloidal silica (PL150H20) at different concentrations and at two pad pressures.

The Cu removal rate and the TaN removal rate were determined using a CDE 1684-point probe, and the $SiO_2$ (TEOS) removal rate was determined using a KLA-Tencor SM300. The TaN removal rate as a function of pH determined at five different pH values is illustrated in FIG. 2. The experimental data show a pronounced decrease in the TaN removal rate as the pH of the aqueous phase is adjusted from 2 to 4. Removal rate data are shown below in Table 3 for Cu, silicon dioxide (TEOS) and TaN.

TABLE 3

| Slurry | Klebosol PL150H20 % | BTA % | $H_2O_2$ % | pH | Polishing pressure psi | Polishing pressure kPa | Cu RR A/min | TEOS RR A/min | TaN RR A/min |
|---|---|---|---|---|---|---|---|---|---|
| B | 4 | 0.6 | 4 | 3 | 1 | 6.9 | 477 | 88 | 323 |
| C | 4 | 0.6 | 4 | 3 | 2 | 13.8 | 769 | 195 | 556 |
| D | 4 | 0.6 | 4 | 3.5 | 1 | 6.9 | 398 | 27 | 148 |
| E | 4 | 0.6 | 4 | 3.5 | 2 | 13.8 | 697 | 123 | 342 |
| F | 4 | 0.6 | 4 | 4 | 1 | 6.9 | 357 | 58 | 128 |
| G | 4 | 0.6 | 4 | 4 | 2 | 13.8 | 602 | 121 | 286 |
| H | 1 | 0.6 | 4 | 3 | 1 | 6.9 | 308 | 43 | 333 |
| I | 1 | 0.6 | 4 | 3 | 2 | 13.8 | 486 | 110 | 993 |
| 6 | 4 | 0.6 | 4 | 2 | 1 | 6.9 | 448 | 172 | 1503 |
| 7 | 4 | 0.6 | 4 | 2 | 2 | 13.8 | 618 | 355 | 2763 |
| 8 | 4 | 0.6 | 4 | 2.5 | 1 | 6.9 | 431 | 160 | 945 |
| 9 | 4 | 0.6 | 4 | 2.5 | 2 | 13.8 | 553 | 355 | 1781 |
| 10 | 1 | 0.6 | 4 | 2 | 1 | 6.9 | 300 | 85 | 1086 |
| 11 | 1 | 0.6 | 4 | 2 | 2 | 13.8 | 415 | 180 | 1718 |

These data show that a pH of less than 3 is necessary to achieve the desired tantalum nitride to copper and tantalum nitride to TEOS selectivity.

Example 3

Figure 3:
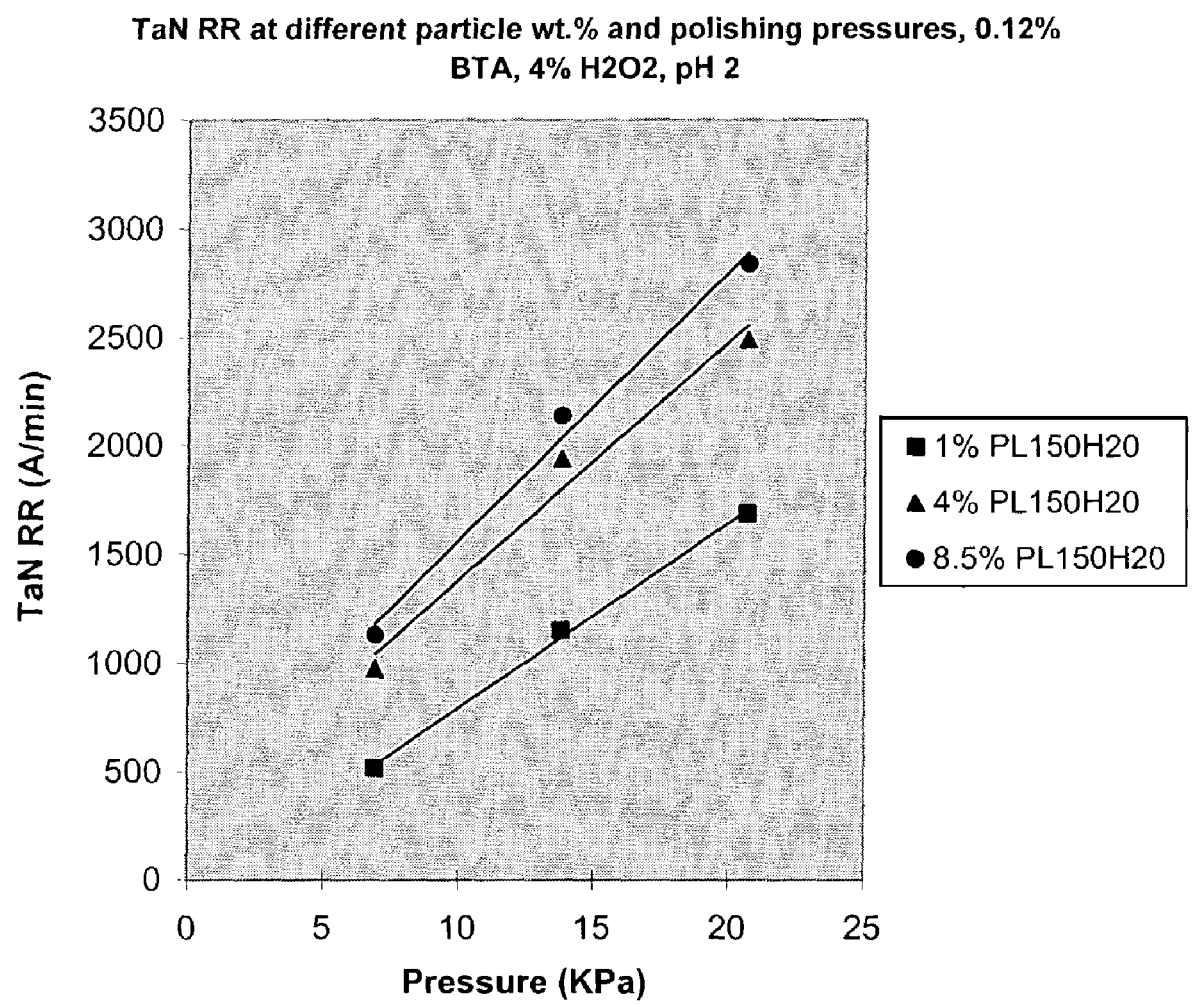
FIG. 3 illustrates a plot of the TaN removal rate versus pad pressure for polishing compositions containing 0.12% BTA and 4% $H_2O_2$ with a pH of 2 at various colloidal silica (PL150H20) concentrations.

Experiments were carried out to determine the TaN removal rate of polishing compositions at various particle concentrations. The experiments were also carried out with a different pad pressures to determine the interaction between particle concentration and pad pressure. The polishing data are illustrated in FIG. 3. The TaN removal rate increases in a linear fashion with increasing pad pressure over the tested range at various particle concentrations. Also, for a given pad pressure, the TaN removal rate increases with increasing particle concentration. Importantly, the data show that a high TaN removal rate is obtained even with low particle concentration and pad pressure.

Example 4

Figure 4:
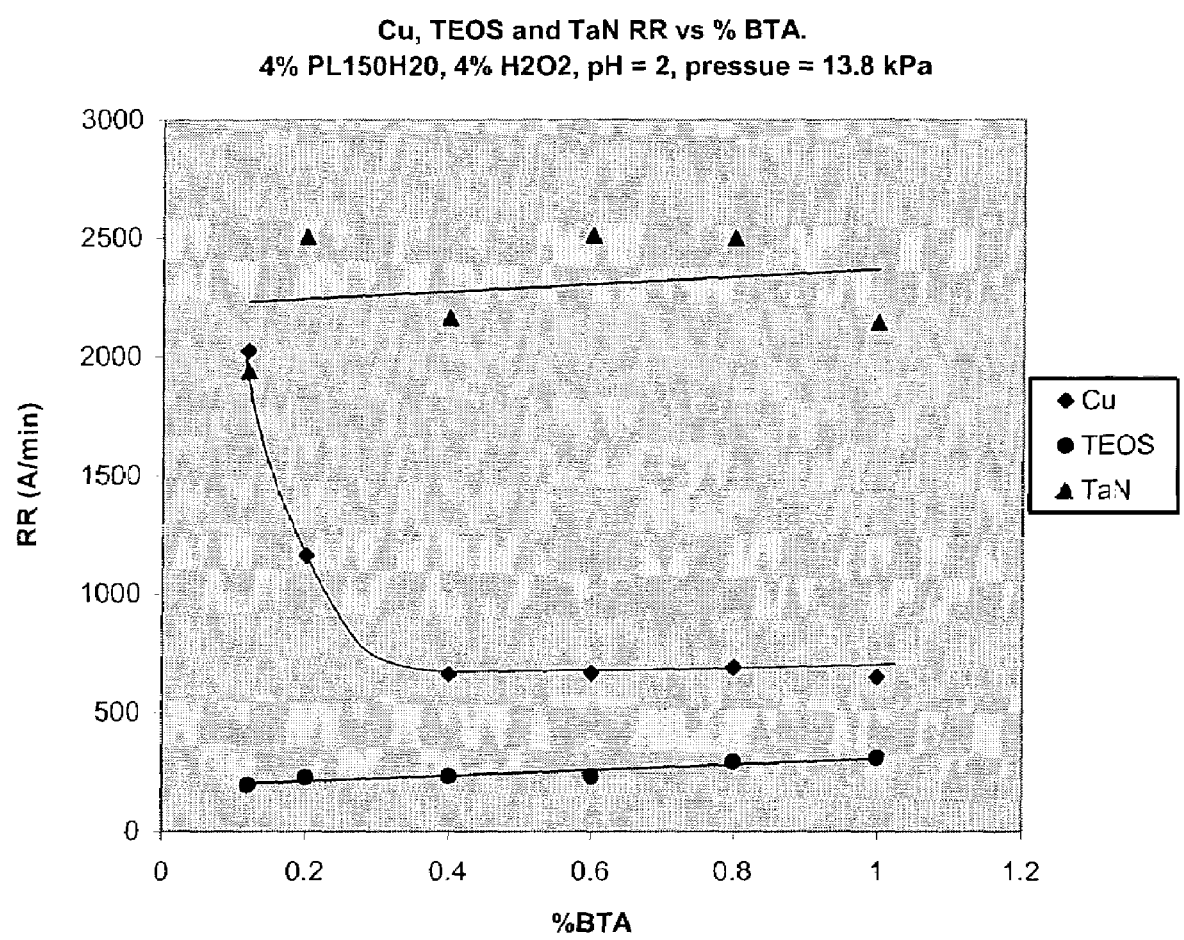
FIG. 4 illustrates a plot of Cu, TaN, and silicon dioxide (TEOS) removal rates for polishing compositions containing 4% PL150H20 and 4% $H_2O_2$ with a pH of 2 at a pressure of 13.8 kPa with varied BTA inhibitor concentrations.

Experiments were carried out to determine the removal rates for Cu, $SiO_2$ (TEOS), and TaN. For these experiments, the samples were polished at a pad pressure of 2 psi (13.8 kPa) using polishing compositions having 4 wt. % colloidal silica, 4 wt. % $H_2O_2$, and a pH of 2. FIG. 4 illustrates Cu, TaN, and $SiO_2$ (TEOS) removal rates at varying concentrations of the primary inhibitor BTA. The Cu removal rate was determined using a CDE 168 4-point probe and the $SiO_2$ removal rate was determined using a KLA-Tencor SM300. The data show a dramatic reduction in the Cu removal rate as the weight percent of BTA is increased to a saturation level. Above the saturation level, increases in BTA concentration do not decreases Cu removal rate significantly in the absence of a secondary inhibitor. Importantly, the $SiO_2$ and TaN removal rates remain relatively constant in comparison to the Cu removal rate. Also, the TaN removal rate remains high over the entire range of BTA concentration.

Example 5

The removal rate of Cu, silicon oxide, and TaN was determined as a function of the secondary corrosion inhibitor concentration (sodium dodecylsulphate). Experiments were carried out using a polishing composition formulated to have a pH of 2. The inventive polishing composition also contained 4 wt. % hydrogen peroxide and 0.6 wt. % primary inhibitor (BTA). The Strausbaugh CMP system was operated with a pad pressure of 2 psi (13.8 kPa).

Figure 5:
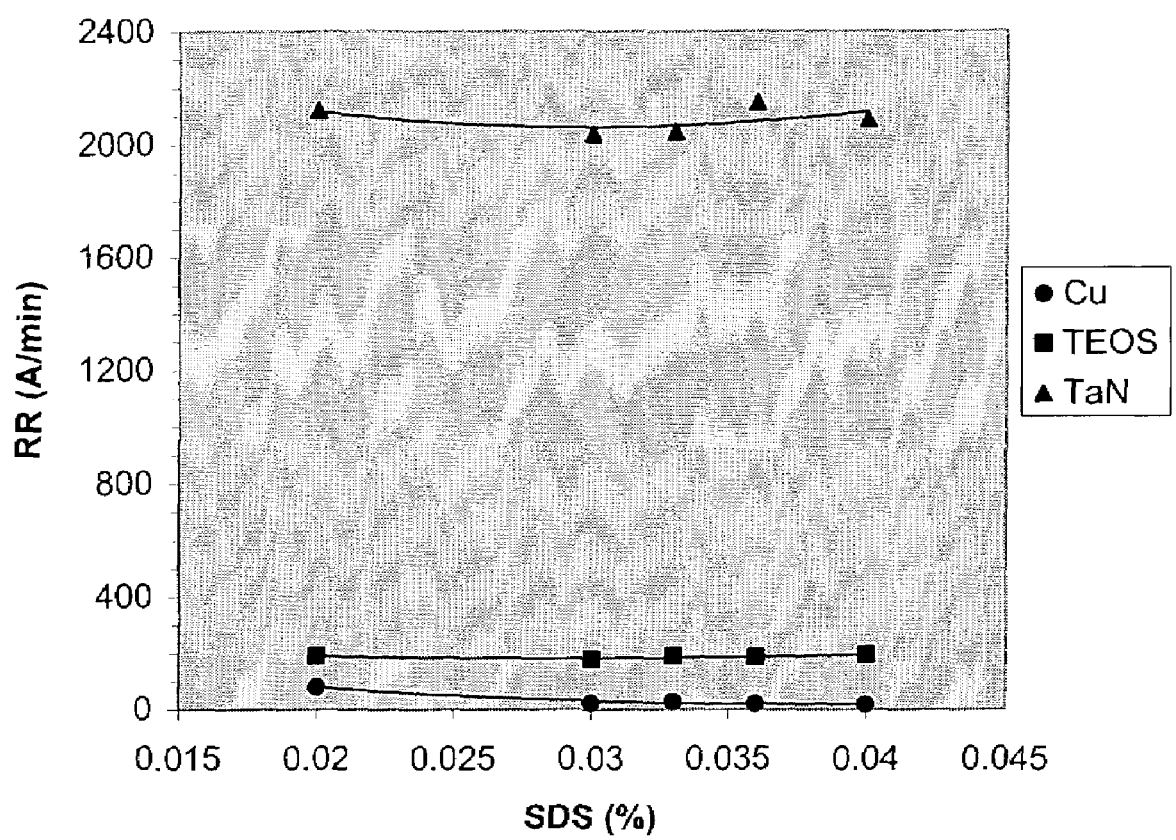
FIG. 5 illustrates a plot of Cu, TaN, and silicon dioxide (TEOS) removal rates for polishing compositions containing 4% PL150H20, 4% $H_2O_2$ and 0.6% BTA with a pH of 2 at a pressure of 13.8 kPa with varied multiple secondary inhibitor concentrations.

The results are shown in FIG. 5. The results show that TaN is removed at a constantly higher rate than $SiO_2$ and Cu across the experimental range of secondary inhibitor concentration. Also, $SiO_2$ is removed at a faster rate than Cu. In these experiments, the Cu removal rate was suppressed to very low values of less than 100 A/min by the secondary corrosion inhibitor.

Example 6

Experiments were carried out to determine the removal rates of Cu, $SiO_2$, and TaN using a polishing composition formulated in accordance with the invention that included a surfactant. For these experiments, an anionic surfactant, Biosoft D-40, was added to the polishing composition to form a surfactant concentration in the aqueous phase of 0.02 wt. %. The active ingredient of Biosoft D-40 is sodium dodecylbenzenesulfonate. The polishing tests were carried out using the IPEC 472 CMP system. The IPEC 472 was equipped with an IC1000 k-grooved polishing pad. Other operational parameters included a table speed of 120 rpm, a carrier speed of 114 rpm, and a slurry flow rate of 200 ml/min. A pad pressure of 1 psi (6.9 kPa) was applied to obtain the removal rates shown below in Table 4.

TABLE 4

| Slurry | Klebosol PL20H12, % | Klebosol PL10H9, % | BTA, % | Biosoft D-40, % | $H_2O_2$ % | pH | Cu RR A/min | TEOS RR A/min | TaN RR A/min |
|---|---|---|---|---|---|---|---|---|---|
| 12 | 4 |   | 0.4 |      | 2 | 2 | 129 | 75 | 853 |
| 13 |   | 4 | 0.4 |      | 2 | 2 | 106 | 79 | 911 |
| 14 |   | 4 | 0.1 | 0.02 | 2 | 2 | 84  | 70 | 1228 |
| 15 |   | 4 | 0.2 | 0.02 | 2 | 2 | 51  | 70 | 839 |
| 16 |   | 4 | 0.3 | 0.02 | 2 | 2 | 14  | 70 | 1155 |
| 17 |   | 4 | 0.4 | 0.02 | 2 | 2 | 27  | 71 | 974 |

The Cu removal rate was lower than the TaN removal rate in all polishing tests. Also, the high TaN removal rate was maintained over a BTA concentration range of 0.1 wt. % to 0.4 wt. %.

Example 7

The slurry formulations 18 to 21 and J of Table 5 included 4 wt % colloidal silica, 0.6 wt % BTA, 0.5 wt % $H_2O_2$ and a pH of 2.5 adjusted with nitric acid. The following Table presents sheet wafer removal rate data on a Mirra CMP polisher. The ing process employed 120 rpm table speed, 114 rpm carrier speed, 1 psi (6.9 kPa) down force, 200 ml/min slurry flow rate and an IC1010/Suba IV pad.

TABLE 5

| Slurry # | Colloidal silica particle size (nm) | Particle size distribution | TaN RR (A/min) | Cu RR (A/min) | TEOS RR (A/min) | SiCN RR (A/min) | CORAL RR (A/min) |
|---|---|---|---|---|---|---|---|
| 18 | 9  | uni-modal | 670  | 108 | 77 | 302 | 170 |
| 19 | 12 | uni-modal | 604  | 127 | 54 | 267 | 141 |
| 20 | 25 | between unimodal and bimodal | 1161 | 67  | 67 | 785 | 176 |

TABLE 5-continued

| Slurry # | Colloidal silica particle size (nm) | Particle size distribution | TaN RR (A/min) | Cu RR (A/min) | TEOS RR (A/min) | SiCN RR (A/min) | CORAL RR (A/min) |
|---|---|---|---|---|---|---|---|
| 21 | 35 | bi-modal | 264 | 56 | 51 | 785 | 128 |
| J | 50 | bi-modal | 160 | 83 | 48 | 634 | 103 |

Figure 6:
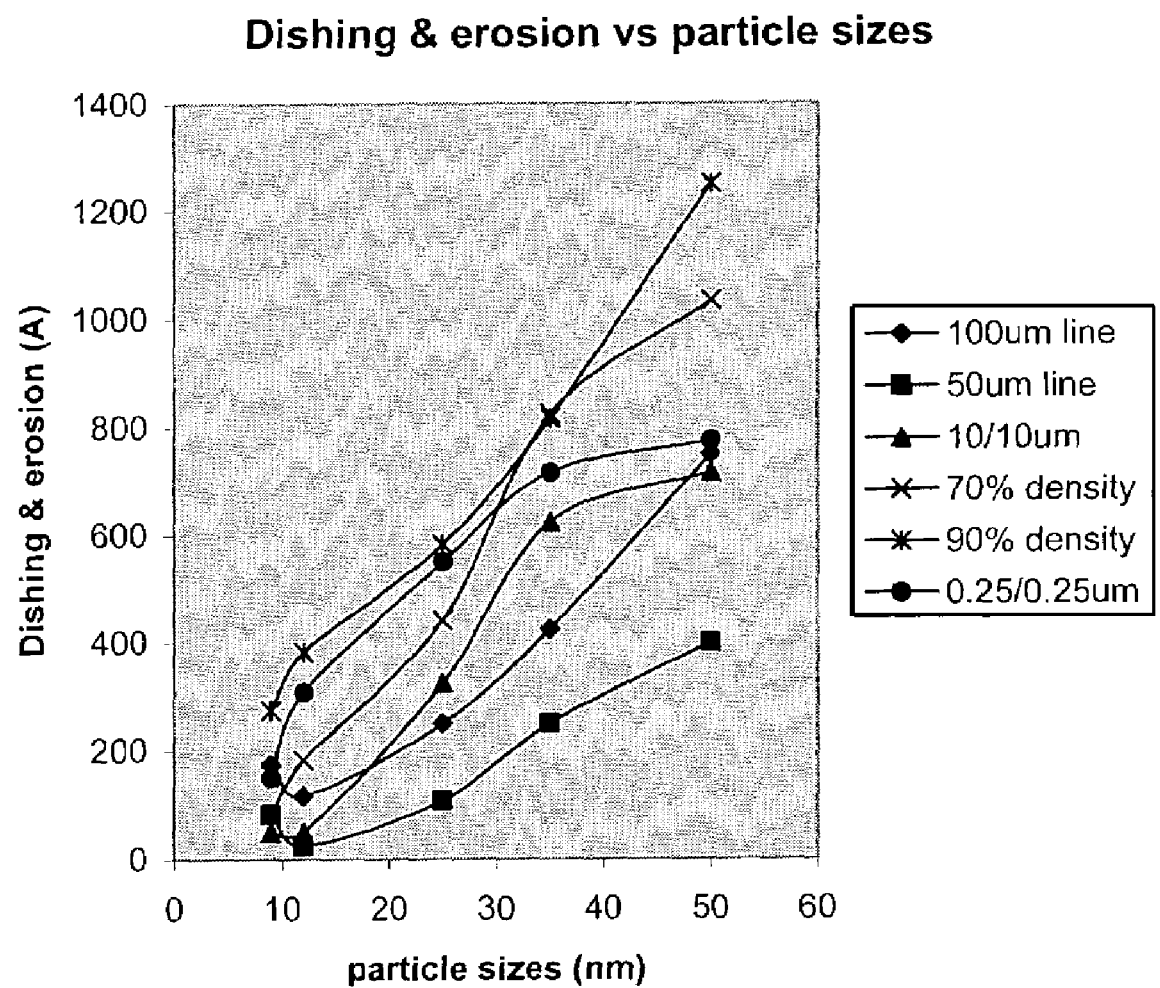
FIG. 6 illustrates copper dishing and TEOS erosion versus colloidal silica particle size for polishing compositions containing 4% colloidal silica, 0.6% BTA, 0.5% $H_2O_2$ and a pH of 2.5 adjusted with nitric acid.

Sematech 854 TEOS pattern wafers were polished on Mirra to evaluate the dishing and erosion performance of different colloidal particles. The polishing process on each platen is illustrated in Table 6; and the dishing and erosion data are shown in FIG. 6.

TABLE 6 polishing process for the Sematech 854 pattern wafers

| | Table speed (rpm) | Carrier speed (rpm) | Down force (psi) | Down force (kPa) | Slurry flow rate (ml/min) | Slurry used | Pad used | Polishing time (second) |
|---|---|---|---|---|---|---|---|---|
| Platen 1 | 93 | 21 | 4 | 27.6 | 150 | EPL2360 | IC1010 on Suba IV | 90 |
| Platen 2 | 33 | 61 | 3 | 20.7 | 80 | RLS2360 | IC1010 on Suba IV | to endpoint |
| Platen 3 | 120 | 114 | 1 | 6.9 | 200 | 18, 19, 20, 21 & J | IC1010 on Suba IV | to endpoint |

*Note:
EPL2360 RLS2360 are copper 1st step slurries, and slurries 18, 19, 20, 21 & J are 2nd step slurries.

The TaN and SiCN sheet wafer removal rates provided a maximum removal rate at 25 nm particle size, while the TEOS, Cu and Coral removal rates were not sensitive to either the particle sizes or distributions. Interestingly, both the dishing and erosion of the 854 TEOS pattern wafers increase with increasing particle size and the size distribution modals. From these results however, it is not clear whether the particle size or the distribution modal numbers dominates the dishing and erosion performance. The 9 nm abrasive particle provided the best dishing and erosion performance. Despite the TaN removal rate decreases with particle size from 25 nm to 9 nm, the removal rate is sufficient for an efficient second-step barrier CMP processes.

In summary, the combination of inorganic acid at low pH, BTA and hydrogen peroxide provides a second-step polishing solution that possesses both a rapid dissolution of barrier materials and excellent selectivity to both interconnect metals, such as copper and dielectric materials. This rapid dissolution of barrier materials allows the CMP process to occur at pressure less than 15 kPa and advantageously at pressures less than 10 kPa. Most advantageously, the CMP planarizing may occur at pressures less than 7.5 kPa.

We claim:

1. A polishing solution useful for removing barrier materials in the presence of interconnect metals and dielectrics comprising 0.1 to 10 weight percent hydrogen peroxide, at least one pH adjusting agent selected from the group consisting of nitric acid, sulfuric acid, hydrochloric acid and phosphoric acid for adjusting a pH level of the polishing solution to less than 3, 0.25 to 1.7 weight percent benzotriazole inhibitor for reducing removal rate of the interconnect metals, 0 to 10 weight percent surfactant, 0.01 to 10 weight percent colloidal silica having an average particle size of less than 50 nm and balance water and incidental impurities, and the polishing solution has a tantalum nitride to copper selectivity of at least 3 to 1 and a tantalum nitride to TEOS selectivity of at least 3 to 1 as measured with a polishing pad pressure measured normal to a wafer less than 15 kPa.

2. The polishing solution of claim 1 wherein the pH adjusting agent is nitric acid and the pH level of the polishing solution is 1.5 to 2.9.

3. The polishing solution of claim 1 wherein the surfactant reduces removal rate of copper interconnects.

4. A polishing solution useful for removing barrier materials in the presence of interconnect metals and dielectrics comprising 0.1 to 5 weight percent hydrogen peroxide, nitric acid for adjusting a pH level of the polishing solution of 1.5 to 2.9 , 0.25 to 1.7 weight percent benzotriazole inhibitor for reducing removal rate of the interconnect metals, 0 to 10 weight percent surfactant, 0.01 to 5 weight percent colloidal silica having an average particle size of less than 50 nm and balance water and incidental impurities, and the polishing solution has a tantalum nitride to copper selectivity of at least 4 to 1 and a tantalum nitride to TEOS selectivity of at least 4 to 1 as measured with a polishing pad pressure measured normal to a wafer less than 15 kPa.

5. The polishing solution of claim 4 wherein the pH level of the polishing solution is 2 to 2.8.

6. The polishing solution of claim 4 wherein the surfactant is an anionic surfactant having a functional group selected from the group consisting of sulfonates, sulfates, carboxylates, phosphates and derivative thereof and the surfactant reduces removal rate of copper interconnects.

7. The polishing solution of claim 4 wherein the average particle size of the colloidal silica is 2 to 15 nm and the colloidal silica has a unimodal size distribution.

8. The polishing solution of claim 4 wherein the polishing solution contains 0.1 to 2 weight percent hydrogen peroxide, 0.25 to 1 weight percent benzotriazole inhibitor, 0 to 5 weight percent surfactant, 0.1 to 2 weight percent colloidal silica and the pH level is 2 to 2.8, the colloidal silica has an average particle size of less than 30 nm and the polishing solution has a tantalum nitride to copper selectivity of at least 5 to 1 and a tantalum nitride to TEOS selectivity of at least 5 to 1 as measured with a polishing pad pressure measured normal to a wafer less than 10 kPa.

9. A method for removing barrier materials from a semiconductor substrate in the presence of interconnect metals comprising the step of planarizing the semiconductor substrate with the polishing solution of claim 1 and a polishing pad at a pressure normal to the semiconductor substrate of less than 15 kPa to provide a tantalum nitride to copper selectivity of at least 3 to 1 and a tantalum nitride to TEOS selectivity of at least 3 to 1.

10. The method of claim 9 wherein the planarizing occurs at a pressure less than 10 kPa, the polishing solution contains 0.1 to 2 weight percent hydrogen peroxide, 0.0025 to 1 weight percent benzotriazole inhibitor, 0 to 5 weight percent surfactant, 0.01 to 2 weight percent colloidal silica and the pH level is 2 to 2.8, the colloidal silica has an average particle size of less than 15 nm and the tantalum nitride to copper selectivity is at least 5 to 1 and the tantalum nitride to TEOS selectivity is at least 5 to 1.

\* \* \* \* \*